(12) United States Patent
Ishio

(10) Patent No.: US 6,875,673 B2
(45) Date of Patent: Apr. 5, 2005

(54) METHOD OF PRODUCING SEMICONDUCTOR DEVICE

(75) Inventor: Seiichiro Ishio, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/729,958

(22) Filed: Dec. 9, 2003

(65) Prior Publication Data

US 2004/0113173 A1 Jun. 17, 2004

Related U.S. Application Data

(62) Division of application No. 10/219,249, filed on Aug. 16, 2002, now Pat. No. 6,686,634.

(30) Foreign Application Priority Data

Aug. 22, 2001 (JP) ........................................ 2001-251897

(51) Int. Cl.[7] .................. H01L 21/301; H01L 21/4763; H01L 21/3063; H01L 21/78
(52) U.S. Cl. ....................... 438/462; 438/622; 438/977; 257/E21.216; 257/E21.559
(58) Field of Search ................................ 438/462, 622, 438/977; 257/E21.216, E21.599

(56) References Cited

U.S. PATENT DOCUMENTS

| 5,360,521 A | 11/1994 | Davis et al. |
| 5,525,549 A | 6/1996 | Fukada et al. |
| 6,020,618 A | 2/2000 | Sakai |

FOREIGN PATENT DOCUMENTS

JP        6-45618        2/1994

*Primary Examiner*—Douglas Wille
*Assistant Examiner*—Shrinivas Rao
(74) *Attorney, Agent, or Firm*—Posz & Bethards, PLC

(57) ABSTRACT

In an integrated pressure sensor including a semiconductor substrate having a p type single crystal silicon substrate and an n type epitaxial layer of which a portion is etched by electrochemical etching to have a diaphragm, an impurity diffusion layer piercing the n type epitaxial layer at least defining the diaphragm is formed for isolation. An etching wire is formed on the surface of the n type epitaxial layer with insulation and the first end of the etching wire extends to the inside of the surface and connected to the n type epitaxial layer. The second opposite end extends to an edge of the semiconductor substrate. The etching wire does not cross the impurity layer inside the surface of the semiconductor substrate to prevent the etching wire from short-circuiting with the impurity diffusion layer during the electrochemical etching.

1 Claim, 13 Drawing Sheets

METHOD OF PRODUCING SEMICONDUCTOR DEVICE

This application is a divisional application of U.S. patent application Ser. No. 10/219,249 filed Aug. 16, 2002 now U.S. Pat. No. 6,686,634, which is based upon and claims the benefit of Japanese Patent Application No. 2001-251897 filed on Aug. 22, 2001, the contents of which are incorporated here in by reference.

BACKGROUND OF THE INVENTION

1. Field of the Invention

This invention relates to a semiconductor device and a method of producing the same, and particularly to a semiconductor device for pressure sensor with an integrated circuit and a method of the same.

2. Description of the Prior Art

Semiconductor devices for detecting a pressure with a diaphragm formed by electrochemical etching are known. U.S. Pat. Nos. 5,360,521, 5,525,549, and Japanese patent application provisional application No. 6-45618 disclose this type of semiconductor devices.

More specifically, a semiconductor wafer is prepared which includes a first semiconductor layer (p type silicon layer) having a first conductivity and a second semiconductor layer (n type silicon layer with a second conductivity laminated with the first semiconductor layer. Next, an integrated circuit is formed for each chip unit on the semiconductor wafer. Next, a diaphragm is formed by electrochemical etching at each chip unit. Then, the semiconductor wafer is cut along scribe lines to provide the semiconductor chips.

During this process, on a surface of the semiconductor wafer, a wire of Al or the like is formed for electrochemical etching at each chip unit. The first semiconductor layer is partially removed to form a hollow portion to provide the diaphragm by applying a voltage to the wire to effect the electrochemical etching.

In each chip unit, impurity diffusion layers, such as a p+ impurity diffusion layer, are formed to isolate respective elements in the integrated circuit from each other. The impurity diffusion layer is formed so as to pierce the second semiconductor layer from the surface of the second semiconductor layer opposite to the first semiconductor layer to the surface of the first semiconductor layer contacting the second semiconductor layer.

In these prior arts, the wire for electrochemical etching crosses the impurity diffusion layer. Here, although, the wire is electrically insulated from the impurity diffusion layer with an insulation film such as an oxide film, the wire may short-circuit with the impurity diffusion layer at a crossing point during electrochemical etching because of defects inherently existing the insulation film or the like.

More specifically, during the electrochemical etching, the wire is supplied with a voltage to provide reverse-bias between the first and second semiconductor layers to conduct the etching in the first semiconductor layer. When a current in the wire rapidly increases, etching is finished.

If the wire short-circuits with the impurity diffusion layer at a crossing point or an overlapping point, the current leaks from the wire to the first semiconductor layer through the impurity diffusion layer. Then, the etching is finished at timing of leakage, so that the desired etching cannot be provided.

Thus, it is required to provide a semiconductor device having a diaphragm for pressure detection and an integrated circuit with a structure or a method for preventing short circuit from the etching wire to the first semiconductor layer through the impurity diffusion layer during electrochemical etching.

SUMMARY OF THE INVENTION

The aim of the present invention is to provide a superior semiconductor device and a superior method of producing the same.

According to the present invention, a first aspect of the present invention provides a semiconductor device comprising:

a semiconductor substrate including a first semiconductor layer having a first conductivity and a second semiconductor layer having a second conductivity on said first semiconductor layer, said first semiconductor layer partially having a hollow portion in a first surface opposite to said second semiconductor layer, a surface of said second semiconductor layer opposite to said first semiconductor layer having first and second areas, said first area defined by a thin portion of said semiconductor substrate provided by said hollow portion, said second area being outside said first area;

an integrated circuit portion at said second area;

an impurity diffusion layer with said first conductivity piercing said second semiconductor layer from said surface of said second semiconductor layer to a second surface of said first semiconductor layer contacting said second semiconductor layer, having a width with respect to said surface of said second semiconductor layer, and extending along said surface of said second semiconductor layer for sectioning said second semiconductor layer into a plurality of blocks for isolation;

a wire with first and second ends on said surface of said second semiconductor layer, insulated from said second semiconductor layer except said first end which is connected to said surface of said second semiconductor layer at the inside of said surface, said second end extending to an edge of said semiconductor substrate, said wire being useable for electrochemical etching said first semiconductor layer to form said hollow portion and said thin portion, wherein said wire does not cross said impurity diffusion layer except at said second end.

According to the present invention, a second aspect of the present invention provides the semiconductor device based on the first aspect, , wherein said impurity diffusion layer has a C-shape portion in respect of said surface of said second semiconductor substantially surrounding said thin portion, said wire extends to the inside of said C-shaped portion through an opening of said C-shaped portion, and said first end is connected to said second semiconductor layer at said inside of said C-shaped portion.

According to the present invention, a third aspect of the present invention provides the semiconductor device based on the second aspect, wherein said impurity diffusion layer further extends from both ends of said C-shaped portion to a peripheral of said semiconductor substrate in parallel as first and second portions, respectively and further extend along edges of said semiconductor substrate to have an outer C-shape around said C-shape portion, said wire extends from said first end at a space between said first and second portions.

According to the present invention, a fourth aspect of the present invention provides the semiconductor device based on the first aspect, further comprising a diode in said second semiconductor layer, wherein said wire is connected to said second semiconductor layer through said diode to prevent a current from flowing from said second semiconductor layer to said wire.

According to the present invention, a fifth aspect of the present invention provides the semiconductor device based on the first aspect, further comprising an insulation layer on said surface of said second semiconductor layer having a thickness t, said wire being arranged on said insulation layer to be insulated from said second semiconductor layer, a minimum distance between said wire and said impurity diffusion layer is larger than t except the edges of said semiconductor substrate.

According to the present invention, a sixth aspect of the present invention provides the semiconductor device comprising the steps of:

preparing a semiconductor wafer including a first semiconductor layer having a first conductivity and a second semiconductor layer having a second conductivity on said first semiconductor layer;

forming, at each chip unit, an impurity diffusion layer with said first conductivity piercing said second semiconductor layer from an surface of said second semiconductor layer opposite to said first semiconductor layer to a surface of said first semiconductor layer contacting said second semiconductor layer, having a predetermined width with respect to said surface of said second semiconductor layer, and extending along said surface of said second semiconductor layer for sectioning said second semiconductor layer into a plurality of blocks for insulation;

forming an integrated circuit portion on said surface of said second semiconductor layer at each chip unit;

forming, at each chip unit, an wire, at a first end, being connected to said second semiconductor layer at the inside of said chip unit and extending, at the second opposite end, to a scribe line defining said chip unit, wherein said wire between said first end and said second end of said wire does not cross said impurity diffusion layer except at said second end;

effecting electrochemical etching said first semiconductor layer with said wire to form said hollow portion and said thin portion; and cutting said semiconductor wafer along said scribe line.

According to the present invention, a seventh aspect of the present invention provides the semiconductor device comprising:

a semiconductor substrate including a first semiconductor layer having a first conductivity and a second semiconductor layer having a second conductivity on said first semiconductor layer, said first semiconductor layer partially having a hollow portion in a first surface opposite to said second semiconductor layer, a surface of said second semiconductor layer opposite to said first semiconductor layer having first and second areas, said first area defined by a thin portion of said semiconductor substrate provided by said hollow portion, said second area being outside said first area;

an integrated circuit portion at said second area;

an impurity diffusion layer with said first conductivity piercing said second semiconductor layer from said surface of said second semiconductor layer to a second surface of said first semiconductor layer contacting said second semiconductor layer, having a width with respect to said surface of said second semiconductor layer, and extending along said surface of said second semiconductor layer for sectioning said second semiconductor layer into a plurality of blocks for isolation;

a wire with first and second ends on said surface of said second semiconductor layer, insulated from said second semiconductor layer except said first end which is connected to said surface of said second semiconductor layer at the inside of said surface, said second end extending to an edge of said semiconductor substrate, said wire being useable for electrochemical etching said first semiconductor layer to form said hollow portion and said thin portion, wherein said impurity diffusion layer has a C-shape portion in respect of said surface of said second semiconductor substantially surrounding said thin portion, said wire extends to the inside of said C-shaped portion through an opening of said C-shaped portion, and said first end is connected to said second semiconductor layer at said inside of said C-shaped portion, wherein said impurity diffusion layer further extends from both ends of said C-shaped portion to a peripheral of said semiconductor substrate in parallel as first and second portions, respectively and further extend along edges of said semiconductor substrate to have an outer C-shape around said C-shape portion, said wire extends from said first end at a space between said first and second portions, and wherein said wire does not cross said impurity diffusion layer except at a non-edge portion of said surface of second semiconductor layer.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

The preferred semiconductor device and the preferred method of producing the same will be described with an example of a pressure sensor S1 having a diaphragm and an integrated circuit.

[First Embodiment]

Figure 1:
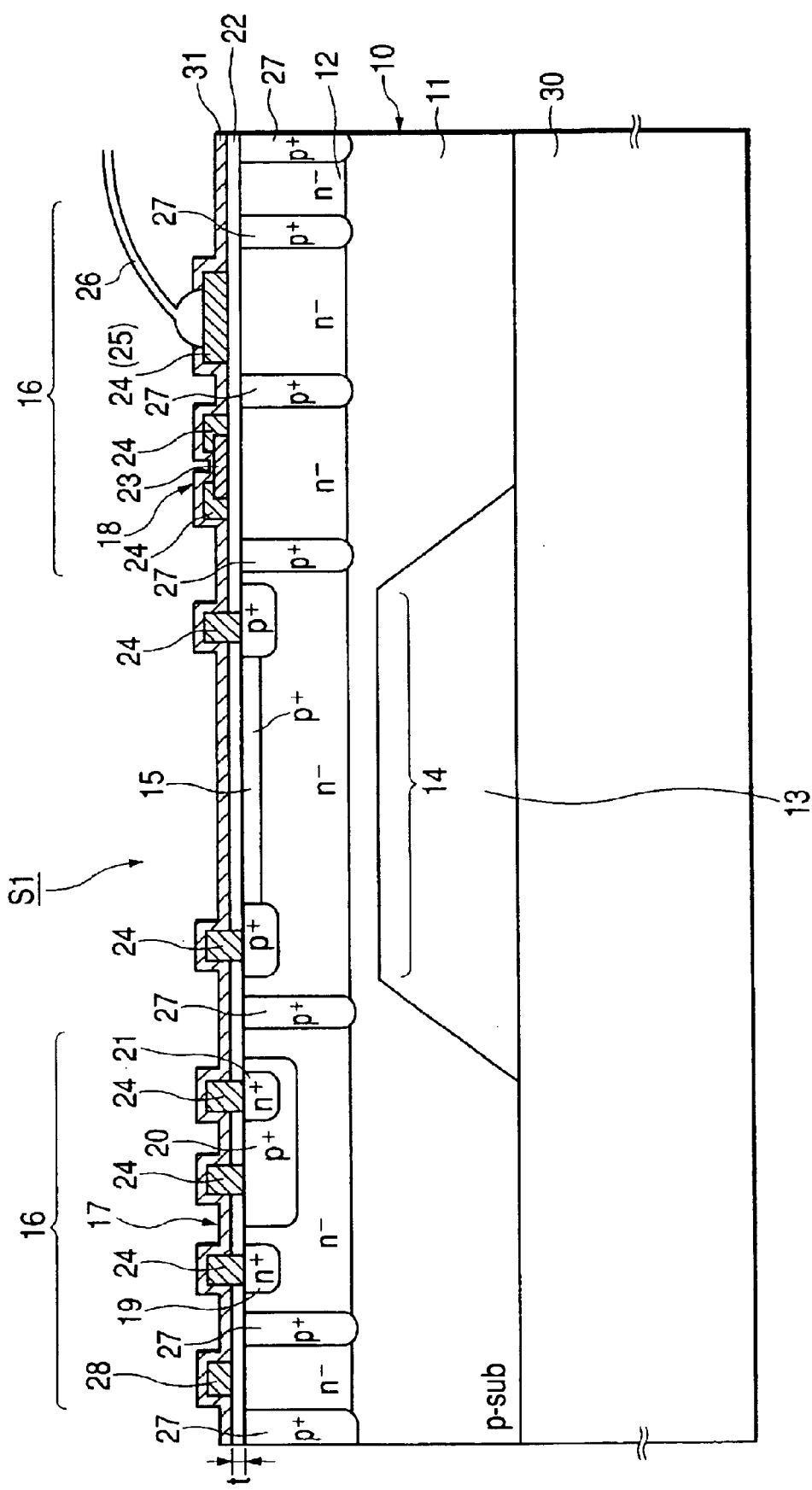
FIG. 1 is a sectional elevation view of the integrated pressure sensor according to a first embodiment of the present invention.
Figure 2:
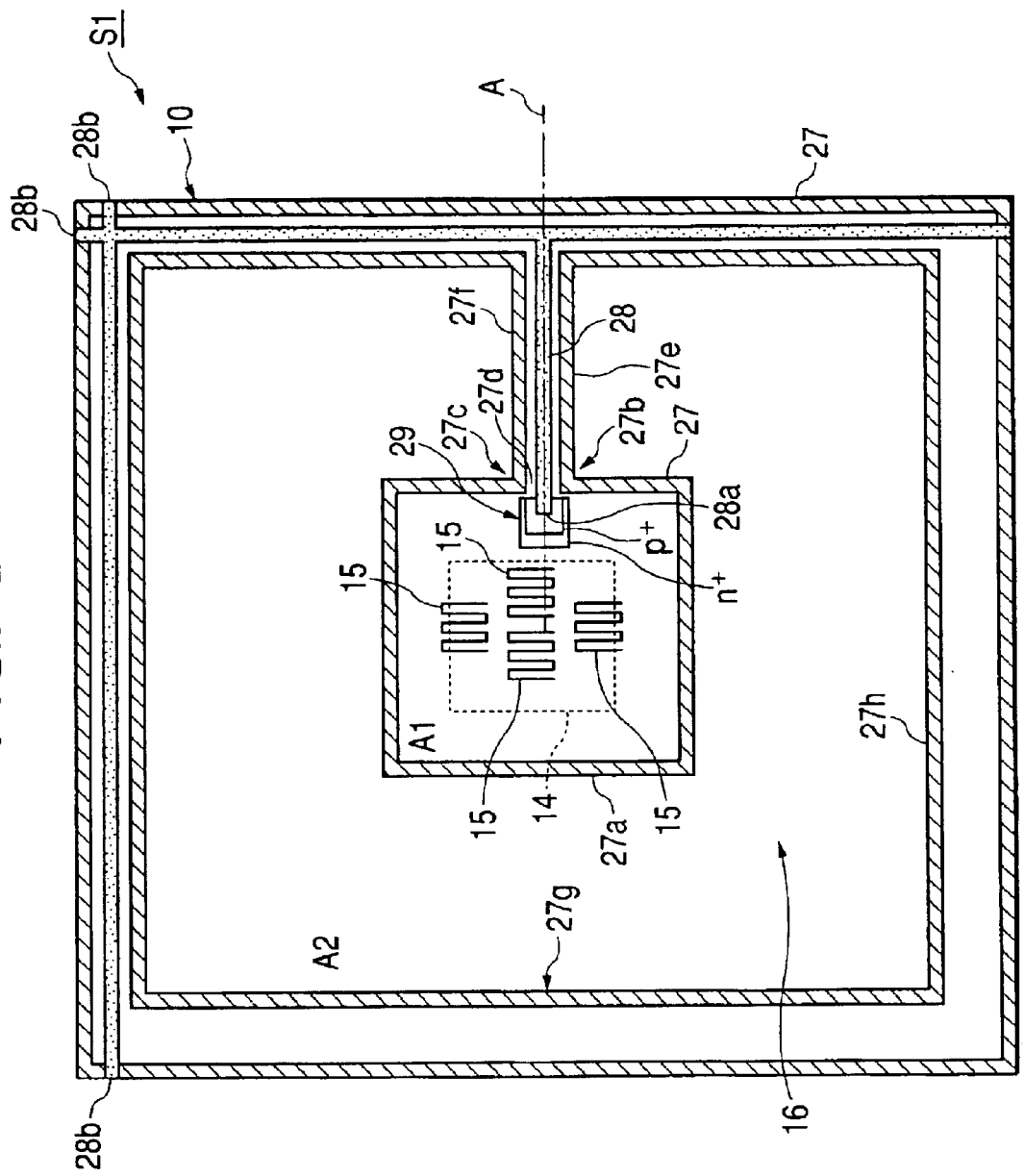
FIG. 2 is a plan view of the pressure sensor shown in FIG. 1.
Figure 3:
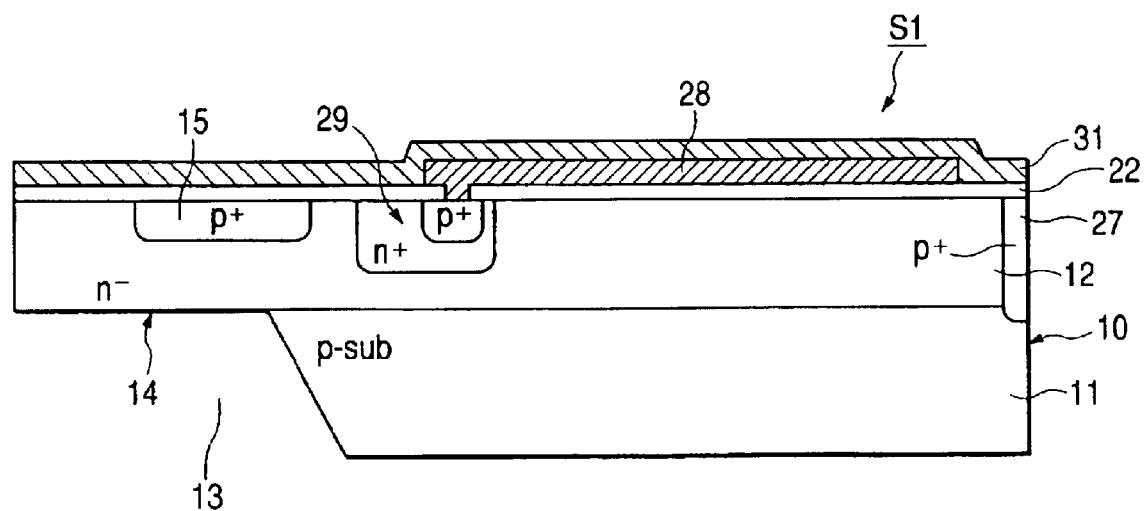
FIG. 3 is a partial sectional elevation view of the pressure sensor, taken on the dashed line A in FIG. 2.

FIG. 1 is a sectional elevation view of the pressure sensor S1 having an integrated circuit structure. FIG. 2 is a plan view of the pressure sensor, which includes hatched portions not to show sectional portions, but to clearly show respective portions. FIG. 3 is a partial sectional elevation view of the pressure sensor S1, taken on the line A in FIG. 2.

The pressure sensor S1 comprises a semiconductor substrate (silicon chip) 10 including a p type single crystal silicon substrate 11 (first semiconductor layer with a first conductivity) and an n type epitaxial layer (second semiconductor layer with a second conductivity) 12 is laminated on the p type single crystal silicon substrate 11.

As shown in FIGS. 1 to 3, at the middle portion of the silicon chip 10, a hollow portion 13 is formed by removing a portion of the p type single crystal silicon substrate 11 from a first surface of the p type single crystal silicon substrate 11 toward the pn-juction layer (second opposite surface) by electrochemical etching. This provides a diaphragm (thin portion) 14 of the p type single crystal silicon substrate 11 and the n type epitaxial layer 12 at the position corresponding the hollow portion 13.

The pressure sensor S1 further comprises a glass pedestal bonded to the first surface of the p type single crystal silicon substrate 11 by anodic bonding in a vacuum to seal the hollow portion 13 to provide a reference pressure chamber. In FIG. 3, the glass pedestal 30 is omitted.

In the surface of the n type epitaxial layer 12 opposite to the p type single crystal silicon substrate 11 at the diaphragm 14, four strain gages (p+ diffusion resistive layers) 15 are formed. Patterns of respective strain gages 15 are arranged in the same direction and folded more than one times to have higher resistances and are connected to the integral circuit in a Wheatstone bridge connection.

Moreover, around the diaphragm 14, that is, at the peripheral of the top surface of the silicon chip 10, an integrated circuit 16 is formed on the n type epitaxial layer 12. The integrated circuit 16 effects signal processing such as amplifying the output signals of the Wheatstone bridge including strain gages 15 and temperature compensation.

The integrated circuit 16 includes circuit elements such as bipolar npn transistors 17, film resistors 18, base resistors (not shown), and capacitors (not shown).

The bipolar npn transistor 17 is provided by forming an n+ collector region 19, a p+ base region 20, and an n+ emitter region 21.

On the surface of the n type epitaxial layer 12 opposite to the p type single crystal silicon substrate 11, a silicon oxide film ($SiO_2$ film) 22 is formed.

On the silicon oxide film 22, the film resistor 18 is provided by forming a film resistive material such as CrSi that is connected to wiring patterns 24 (aluminum or the like) of the integrated circuit 16.

Moreover, the wiring patterns 24 provide electrical connection between the strain gages 14 and the integrated circuit 16 and between respective circuit elements of the integrated circuit 16. Further, as shown in FIG. 1, the wiring patterns 24 are formed as a pad 25 to be connected to a bonding wire 26 for electrical connection between the integrated circuit 16 and the external.

In the silicon chip 10, as shown in FIGS. 1 and 2, p+ impurity diffusion layers (impurity diffusion layers with a first conductivity) 27 are formed so as to pierce the n type epitaxial layer 12 such that it extends from the surface of the n type epitaxial layer 12 opposite to the p type single crystal silicon substrate 11 to the second surface of the p type single crystal silicon substrate 11 contacting the n type epitaxial layer 12 to section the n type epitaxial layer 12 into a plurality of blocks for insulation. In FIG. 2, the p+ impurity diffusion layers 27 are shown by hatching.

The p+ impurity diffusion layer 27 is provided for isolation (insulation) among respective circuit elements (17 or 18) of the integrated circuit 16. Thus, the respective circuit elements are formed within the isolation region surrounded by the p+ impurity diffusion layer 27.

On the top surface of the silicon chip 10, that is, on the silicon oxide film 22, an etching wire 28 is formed with aluminum or polysilicon or the like for the use of electrochemical etching of the hollow portion 13. In FIG. 2, the etching wire 28 is clearly shown with dotted portions.

As shown in FIGS. 2 and 3, a one end 28a of the etching wire 28 is electrically connected to the n type epitaxial layer 12 at the inside portion of the second surface of the n type epitaxial layer 12. The etching wire 28 extends to edges of the silicon chip 10 as other ends of the etching wire 28. The etching wire 28 is arranged not to cross the impurity diffusion layer 27 between the one end 28a and other ends 28b.

Moreover, the impurity diffusion layer 27 has a C-shape portion 27a in respect of the surface of the second semiconductor, substantially surrounding the diaphragm 14 (thin portion). The etching wire 28 extends to the inside of the C-shaped portion 27a through an opening 27d of the C-shaped portion 27a. The one end 28a is connected to the second semiconductor layer at the inside of the C-shape portion 27a.

The impurity diffusion layer 27 further extends from both ends 27b and 27c of the C-shaped portion 27a to a peripheral of the semiconductor substrate 10 in parallel as first and second portions 27e and 27f, respectively, and further extends in the vertical opposite directions (in the drawing) along an edge of the semiconductor substrate and further extends along the remaining edges to be connected to each other at the point 27g to have an outer C-shape 27h extending along edges of the semiconductor substrate around the C-shape portion 27a, wherein the etching wire 28 extends from the one end 28a between the first and second portions 27e and 27f. The impurity diffusion layer 27 separates the surface of the n type epitaxial layer 12 into first and second areas A1 and A2. The sensing circuit (Whetstone bridge) including the strain gage 15 for detecting a physical quantity such as a pressure is arranged at the first area A1, and the integrated circuit 16 (processing circuit) for processing an output from the sensing circuit is arranged at the second area A2.

The etching wire 28 is insulated from the n type epitaxial layer 12 with the silicon dioxide film 22 except the one end 28a. At the one end 28a, the silicon dioxide film 22 has a contact hole to provide the connection between the etching wire and a contact area of the n type epitaxial layer 12. Here, the silicon dioxide film 22 has a thickness t.

Moreover, as shown in FIG. 3, at the contact area, an ohmic contact type of diode 29 is provided by forming a p+ diffusion layer in the n+ diffusion layer in n type epitaxial layer 12. Thus, the one end 28a of the etching wire 28 is electrically connected to the n type epitaxial layer 12 through the diode 29.

At edges of the silicon chip 10, the impurity diffusion layer 27 is also formed. Therefore, other ends 28b of the etching wire 28 overlap with the impurity diffusion layer 27. However, the etching wire 28 does not cross the impurity diffusion layer 27 between the one end 28a and other ends 28*b* (excluding other ends). In other words, the etching wire 28 dose not cross the impurity diffusion layer 27 at the inside area (non-edge portion) of the silicon chip 10. Accordingly, the minimum distance between the etching wire 28 and the impurity diffusion layer 27 is larger than t except the edges of the silicon chip 10.

The impurity diffusion layer 27 at the edges of the silicon chip 10 is arranged along the scribe lines 101 for a dicing cut process (mentioned later). That is, the impurity diffusion layer 27 at the edges of the silicon chip 10 is preferably provided for preventing leakage at the pn junction interface. In other words, in the absence of the impurity diffusion layer 27, leakage may occur because at the edges of the silicon chip 10 after the dicing cut, the pn junction interface (the interface between the p type single crystal silicon substrate 11 and n type epitaxial layer 12) with its disturbed crystal structure is exposed.

As mentioned above, the wiring patterns 24 and the etching wire 28 are formed on the silicon oxide film 22, and the one end 28*a* of the etching wire 28 and necessary positions of the wiring patterns 24 are electrically connected to the n type epitaxial layer 12 through contact (through) holes in the silicon oxide film 22.

On the wiring patterns 24, the etching wire 28, and the silicon oxide film 22, a protection film 31 of silicon nitrate film or the like is formed to protect the surface of the integrated pressure sensor S1. The protection film 31 is partially removed to have openings on the pad 25 to which the bonding wire 26 is to be connected.

In this integrated presser sensor S1, when a pressure is applied to the diaphragm 14, the diaphragm 14 bends. This generates strain in the diaphragm 14, so that the Wheatstone bridge including the strain gages 15 outputs a detection signal that is processed by the integrated circuit 16. The output of the integrated circuit 16 is outputted through the bonding wire 26.

Figure 4:
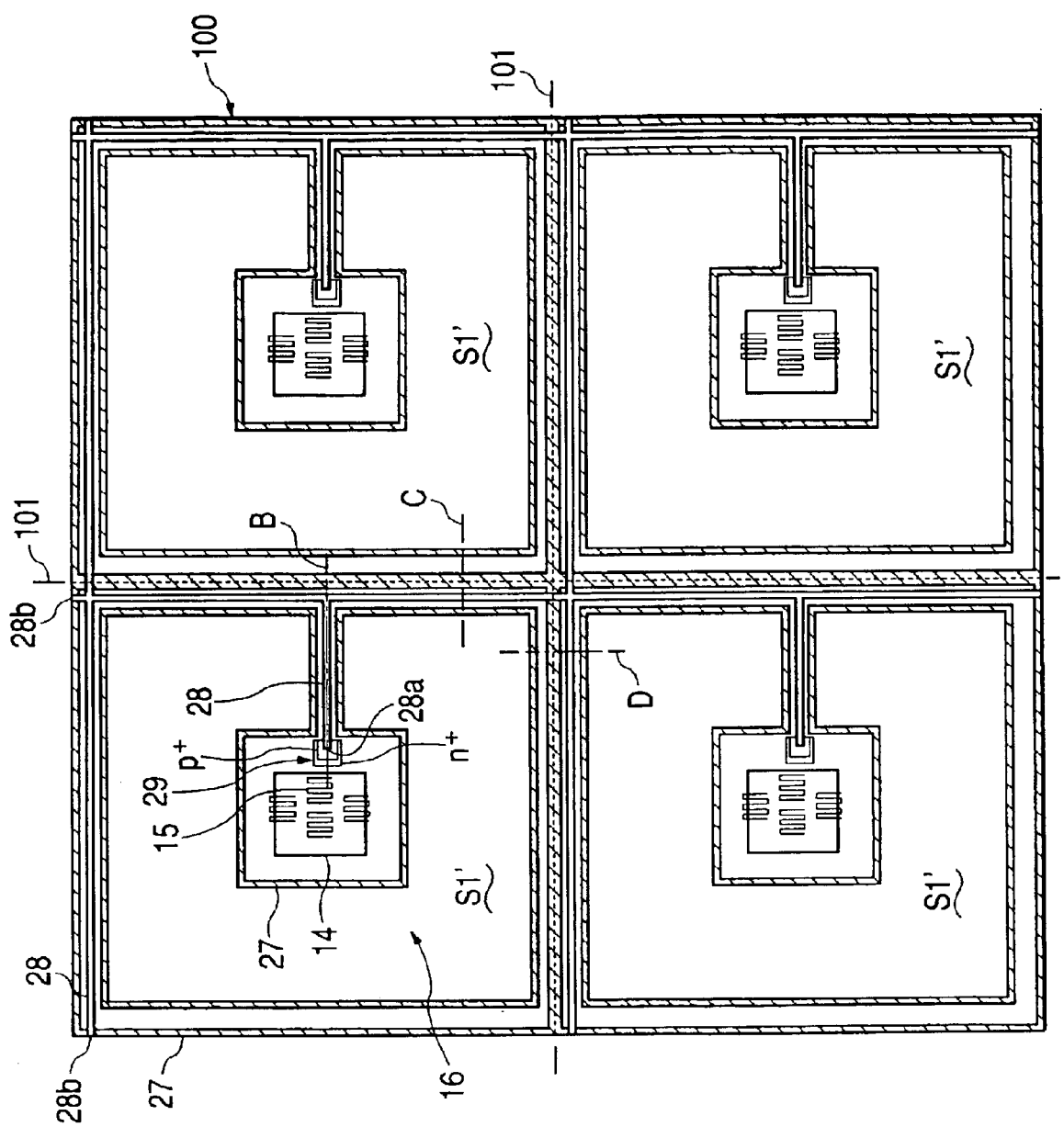
FIG. 4 is a plan view of the silicon wafer including chip areas of the integrated pressure sensors shown in FIG. 1.
Figure 5A:
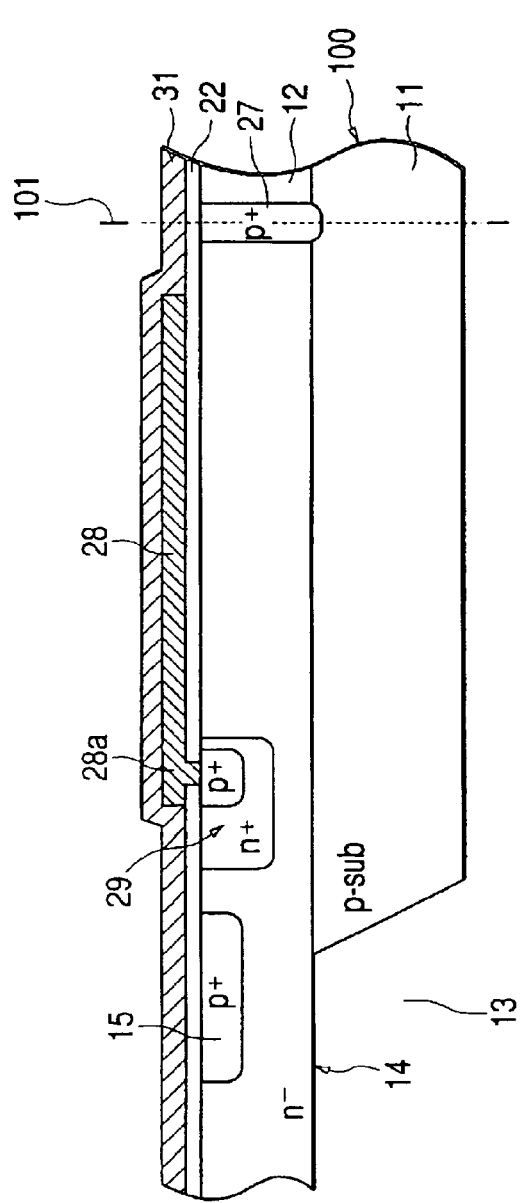
FIG. 5A is a partial sectional elevation view of the silicon wafer, taken on the dashed line B in FIG. 4.
Figure 5B:
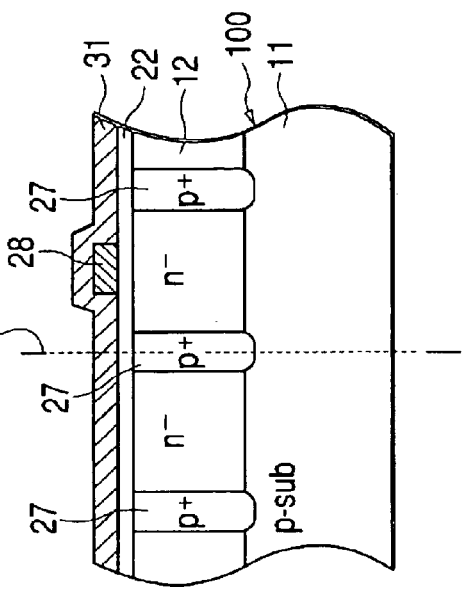
FIG. 5B is a partial sectional elevation view of the silicon wafer, taken on the dashed line C in FIG. 4.
Figure 5C:
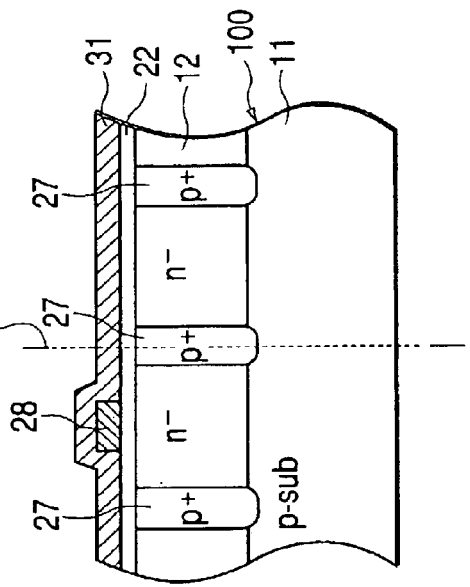
FIG. 5C is a partial sectional elevation view of the silicon wafer, taken on the dashed line D in FIG. 4.

Prior to describing a method of producing the integrated pressure sensor S1, the structure of silicon wafer 100 for the integrated pressure sensor S1 will be described with reference to FIGS. 4 and 5. FIG. 4 shows a plan view of the silicon wafer 100 including chip areas of the integrated pressure sensors. FIG. 5A is a partial sectional elevation view of the silicon wafer, taken on the dashed line B in FIG. 4, FIG. 5B is a partial sectional elevation view of the silicon wafer, taken on the dashed line C in FIG. 4, and FIG. 5C is a partial sectional elevation view of the silicon wafer, taken on the dashed line D in FIG. 4.

FIG. 4 shows the silicon wafer (semiconductor wafer) 100 including the p type single crystal silicon substrate 11 and n type epitaxial layer 12 laminated on the p type single crystal silicon substrate 11 on which four chip units S1' are formed with sectioning with describe lines 101 (shown with chain lines).

In the silicon wafer 100, the impurity diffusion layer 27, the integrated circuits 16, and diaphragms 14 are formed at each chip unit S1'. Moreover, as mentioned earlier, the impurity diffusion layer 27 is formed under the scribe lines 101 arranged between chip units. Thus, the impurity diffusion layers 27 under the describe lines 101 are partially cut. Thus, the impurity diffusion layers 27 are remained at edges of respective silicon chip 10.

Moreover, as shown in FIGS. 4 and 5A, at each chip unit S1', the etching wire 28 extends to the inside area of the chip unit S1' to contact with the n type epitaxial layer 12 at the one end 28*a* thereof and extends along edges of the chip unit S1' (vertically in FIG. 4) to the scribe lines 101 at the upper and lower (in FIG. 4) edges of the chip unit S1', wherein the etching wire 28 does not cross the impurity diffusion layer 27 at the inside area of the chip unit S1'. Here, the etching wire vertically (in FIG. 4) extends on the silicon oxide film 22 at the place other than the spaces just above the impurity diffusion layer 27, as shown in FIG. 5B. Similarly, the etching wire 28 horizontally (in FIG. 4) extends on the silicon oxide film 22 at the place other than the spaces just above the impurity diffusion layer 27 as shown in FIG. 5C.

Further, these etching wires 28 extend to the neighbor chip units S1'. Thus, these etching wires 28 form a grid, wherein each mesh (etching wires 28) in each chip unit S1' is electrically connected to the meshes in the neighbor chip units S1'.

As mentioned above, respective integrated pressure sensors S1 are formed in the silicon wafer 100 at the chip unit S1'. Next, the method of producing the integrated pressure sensor S1 will be described with reference to FIGS. 6A, 6B, 7A to 7C, 8A to 8C, and 9 that show processes of producing the integrated pressure sensor S1.

Figure 6A:
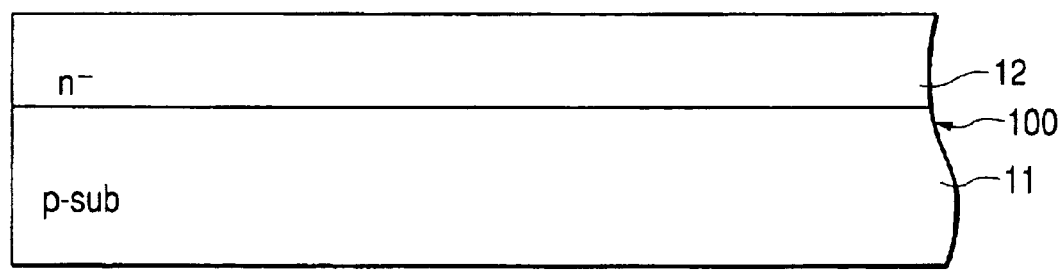
FIGS. 6A, 6B, 7A to 7C, and 8A to 8C are partial sectional elevation views of the silicon wafer illustrating processes according to the first embodiment.
Figure 6B:
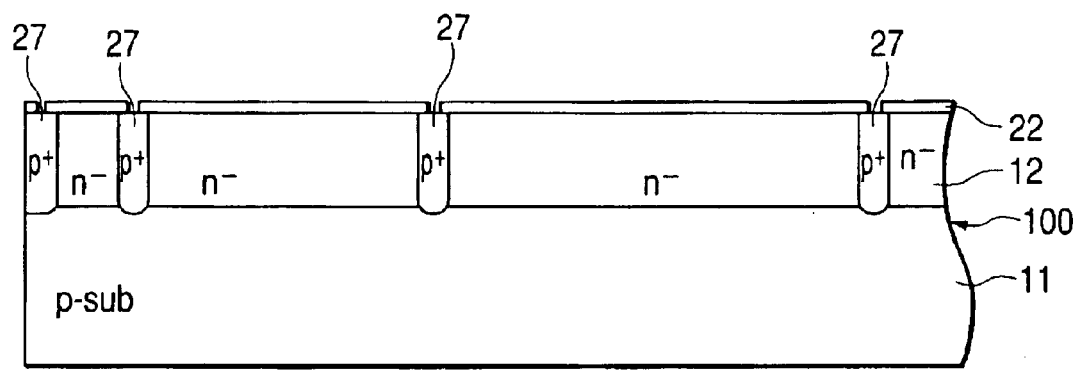

As shown in FIG. 6A, the silicon wafer 100 including the p type single crystal silicon substrate 11 and n type epitaxial layer 12 laminated with the p type single crystal silicon substrate 11 is prepared. This silicon wafer 100 is subjected to the following processes at every chip unit S1'.

At first, the impurity diffusion layer 27 with a predetermined width is formed to provide isolation regions (isolation diffusion process). More specifically, the silicon oxide film 22 is formed by thermal oxidation. Next, through holes are made in the silicon oxidation film 22 at predetermined positions by etching. The impurity diffusion layer 27 is formed by ion injection and thermal diffusion using the silicon oxide film 22 as a mask.

Thus, the isolation diffusion process provides the impurity diffusion layer 27 piercing the n type epitaxial layer 12 extending from the surface of n type epitaxial layer 12 opposite to the p type signal crystal silicon substrate 11 to the p type single crystal silicon substrate 11 with first conductivity.

Figure 7A:
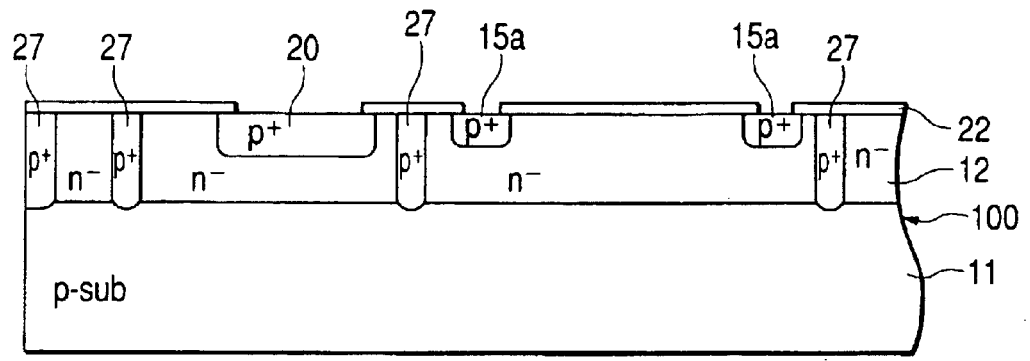

Next, as shown in FIG. 7A, at respective isolation regions, a p+ base region 20 for the bipolar npn transistor 17 and p+ diffusion layer 15*a* for the contact for the strain gages 15 are formed by ion injection (through ion implantation) and thermal diffusion (base diffusion process).

Figure 7B:
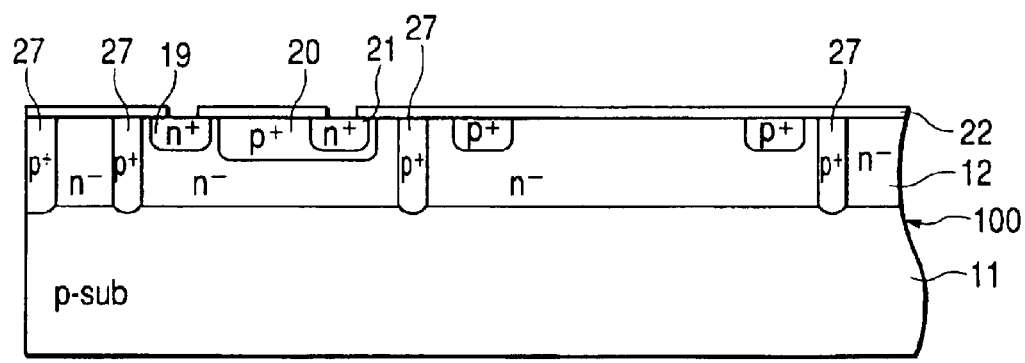

Next, in an emitter diffusion process in FIG. 7B, an n+ collector region 19 and an n+ emitter region 21 for the bipolar npn transistor 17 are formed by ion injection and thermal diffusion in the same way as that shown in FIG. 7A.

Next, in a strain gage forming process, p+ diffusion resistive layers for strain gages 15 are formed by ion injection and thermal diffusion in the same way as that shown in FIG. 7A.

Figure 7C:
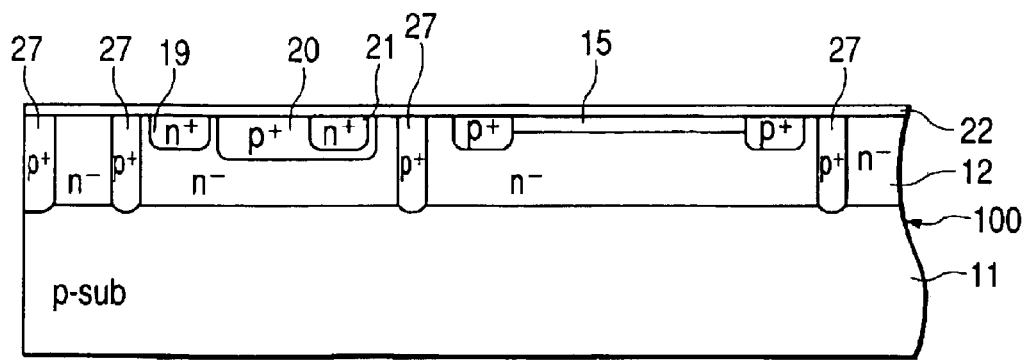

During these processes shown in FIGS. 7A to 7C, other circuit elements in the integrate circuit 16 and the diode 29 are formed also.

For example, base resistors and capacitors (not shown) in the integrated circuit 16 can be formed in the base diffusion process and the emitter diffusion process at the same time. Moreover, the silicon oxide film 22 is formed as shown in FIG. 7C. Further, the film resistors 23 are formed by deposition or spattering.

Figure 8A:
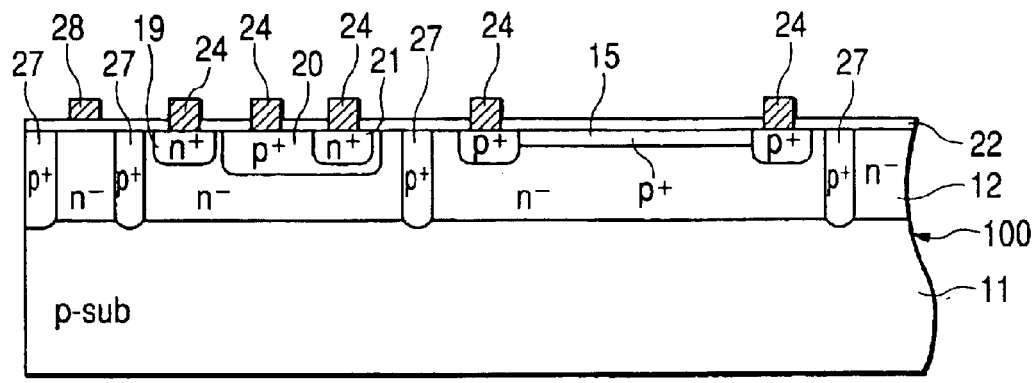
Figure 8B:
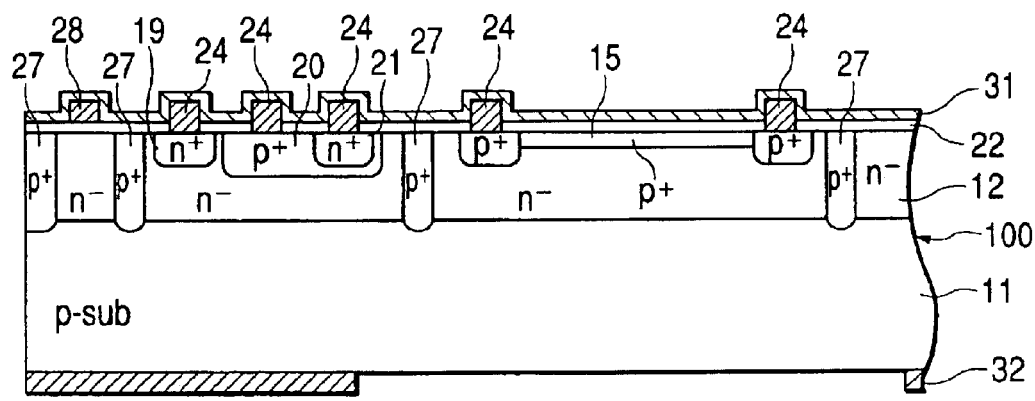

Next, as shown in FIG. 8A, through holes are formed in the silicon oxide film 22 by etching at positions where contact is required between circuit elements formed in the n type epitaxial layer 12 and wiring patterns 24. Then, aluminum is deposited to form the wringing patterns 24 and the etching wires 28.

The processes shown in FIGS. 7A to 7C and 8A form the integrate circuits 16 on the silicon wafer 100. Moreover, the process shown in FIG. 8A forms the etching wires 28 such that the etching wire 28 extends to the inside area of the chip unit S1' to contact the n type epitaxial layer 12 at the first end 28a thereof and extends along an edge of the chip unit S1' (vertically in FIG. 4) to the scribe lines 101 at the upper and lower (in FIG. 4) edges of the chip unit S1', wherein the etching wire 28 does not cross the impurity diffusion layer 27 at the inside area of the chip unit S1'.

Next, the protection film 31 comprising a silicon nitride film or a silicon oxide film is formed by CVD method or spattering (protection film forming process). Moreover, a predetermined portion of the etching wire 28 (not shown) is removed to form a contact that is electrically connectable to the external for the electrochemical etching.

Next, the bottom surface of the silicon wafer 100 is polished to have a mirror surface, and then, a mask 32 of silicon nitride film is formed on the mirror surface with an opening for forming the hollow portion 13 at each chip unit S1'.

Figure 8C:
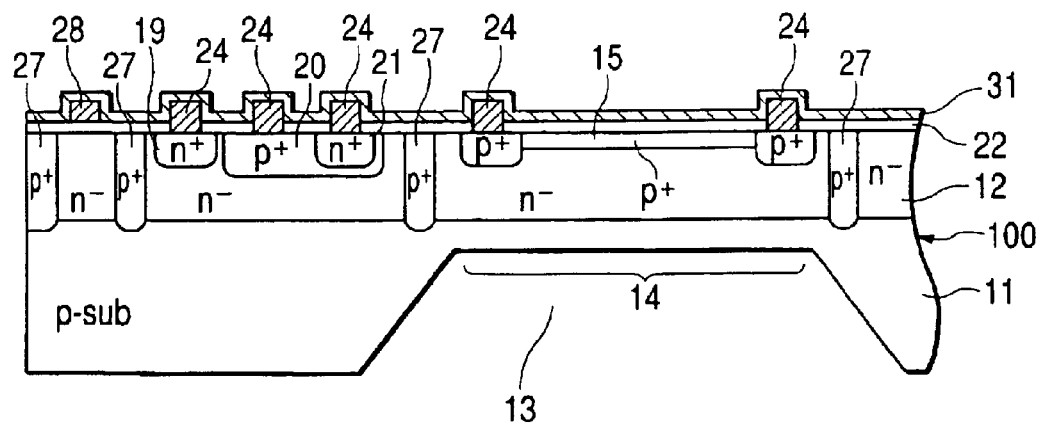

Next, the electrochemical etching is made to have the structure shown in FIG. 8C. This process removes portions of the p type single crystal silicon substrate 11 to form the diaphragms 14.

Figure 9:
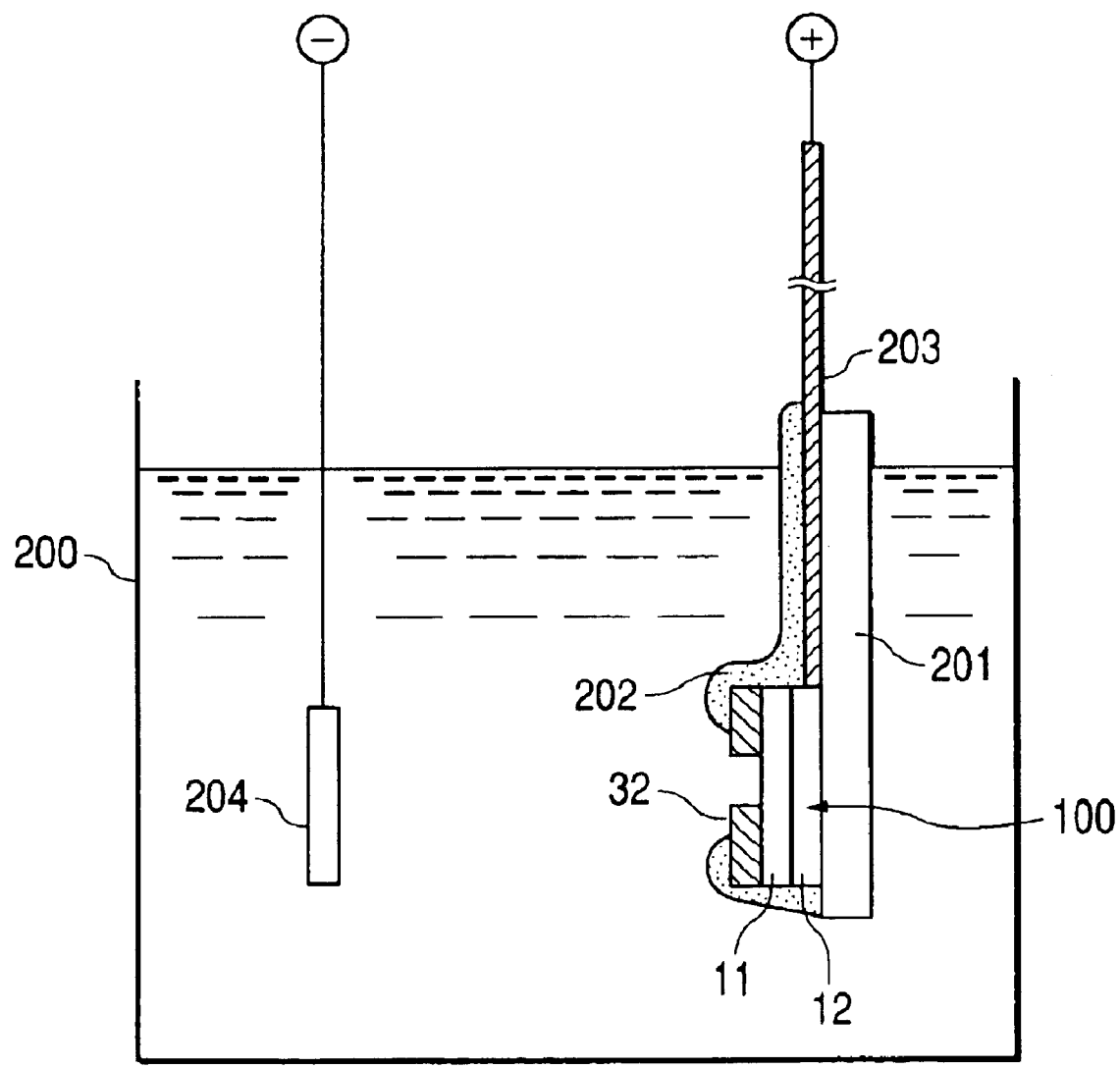
FIG. 9 is an illustration illustrating the electrochemical etching according to the first embodiment.

More specifically, as shown in FIG. 9, the electrochemical etching is made. The silicon wafer 100 is dipped in an etchant such as KOH and TMAH (tetramethlammonium hydroxide). In FIG. 9, only one opening is shown in the mask 32. In fact, there are openings 32 for respective silicon chips 10.

The silicon wafer 100 is fixed to a holding member 201 of ceramic or the like with wax 202. The holding member 210 has a wire 203 of platinum or the like extending to the external. The wire 203 is electrically connected to the contact portion of the etching wire 28 in the silicon wafer 100.

The wax 202 covers the surfaces of the silicon wafer 100 with an open portion to expose to the etchant the surface of the mask 32 and the bottom (mirror) surface of the silicon wafer 100 at the openings in the mask 32. The counter electrode 204 for electrochemical etching is also dipped in the etchant. The wire 203 and the electrode 204 are connected to a power supply for electrochemical etching.

During this electrochemical etching process a supply voltage is applied from the wire 203 to generate reverse bias at the pn junction of the silicon wafer 100 through the diode 29 and the n type epitaxial layer 12.

This condition makes the p type single crystal silicon substrate 11 in the silicon wafer 100 etched from the surface exposed to the etchant toward the pn junction. When the etching reaches the neighborhood of the pn junction interface, the etching stops. The depletion layer extending from the pn junction interface into the p type single crystal silicon substrate 11 defines the stop position.

This process provides the diaphragm 14 as shown in FIG. 8C. The thickness of the diaphragm 14 is substantially determined by the accuracy in forming the n type epitaxial layer 12 and the width of the depletion layer, so that the thickness of the diaphragm can be controlled with a high accuracy.

After this electrochemical etching process, the glass pedestal 30 is bonded to the bottom surface of the silicon wafer 100 by anodic bonding or the like. Next, the silicon wafer 100 with the glass pedestal 30 is dicing-cut along the scribe lines 101 at chip unit S1' (wafer cutting process). As a result, the integrated pressure sensors S1 having the structure shown in FIGS. 1 to 3 are produced.

Here, according to this embodiment, the etching wire 28 does not cross the impurity diffusion layer 27 between its both ends 28a and 28b at the inside area of the silicon chip 10. In other words, there is no cross point between the etching wire 28 and the impurity diffusion layer 27 at the inside area of the silicon chip 10.

On the other hand, at the edges of the silicon chip 10, the second ends 28b of the etching wire 28 overlap the impurity diffusion layer 27 at the edges of the silicon chip 10.

However, although the etching wire 28 short-circuits with the impurity diffusion layer 27 at the overlap portions at the edge of the silicon chip 10, the distance from the short-circuited portion to the etched surface (the surface of p type single crystal silicon substrate 11 exposed to the etchant at the openings of the mask 32), that is, the current leakage path distance is long, and the concentration of the impurity is $10^{15}$ cm$^{-3}$, which is relatively low, so that the current leakage path has high resistance. Thus, the intensity of the leak current is extremely low. Accordingly, this short-circuit at the edge of the silicon chip 10 does not largely affect the electrochemical etching.

Therefore, the structure according to this embodiment substantially prevents the short circuit between the etching wire 28 and the impurity diffusion layer 27 during electrochemical etching, so that this embodiment provides the integrated pressure sensor S1 and the method of producing the same that allow the desired electrochemical etching.

Moreover, in this embodiment, the one end 28a of the etching wire is electrically connected to the n type epitaxial layer 12 through the diode 29 of ohmic contact type which is capable of preventing a current from flowing from the n type epitaxial layer 12 to the etching wire 28.

More specifically, a reverse leakage current from the circuit elements 17 or the strain gages 15 formed on the n type epitaxial layer 12 to the etching wire 28 can be prevented by the diode 29. This may improve the sensitivity of the pressure sensor and the characteristics of the circuitry in this pressure sensor.

As mentioned above, in the method of producing the semiconductor device, a silicon (semiconductor) wafer 100 is prepared which includes a first semiconductor layer 11 having a first conductivity and a second semiconductor layer 12 having a second conductivity on the first semiconductor layer.

At each chip unit S1', the impurity diffusion layer 27 with the first conductivity is formed so as to pierce the second semiconductor layer 12 from the surface of the second semiconductor layer opposite to the first semiconductor layer 11 to the surface of the first semiconductor layer 11 contacting the second semiconductor layer 12, having a width with respect to the surface of the second semiconductor layer 12, and extending along the surface of the second semiconductor layer 12 to section the second semiconductor layer 12 into a plurality of blocks for insulation or isolation.

Next, the integrated circuit 16 is formed on the surface of the second semiconductor layer 12 at each chip unit S1'.

At each chip unit S1', the etching wire is formed such that, at the first end 28a is connected to the second semiconductor layer 12 inside the chip unit S1' and the etching wire 28 extends, at the second opposite end 28, to a scribe line 101 defining the chip unit S1', wherein the etching wire between the first end 28a and the second end 28b of the etching wire 28 does not cross the impurity diffusion layer 27 except at the second end 28b.

Next, the first semiconductor layer 11 is electrochemical etched with the etching wire 28 to form the hollow portion 13 and the thin portion (diaphragm) 14.

Next, the silicon wafer 100 is cut along the scribe line 101.

[Second Embodiment]

Figure 10:
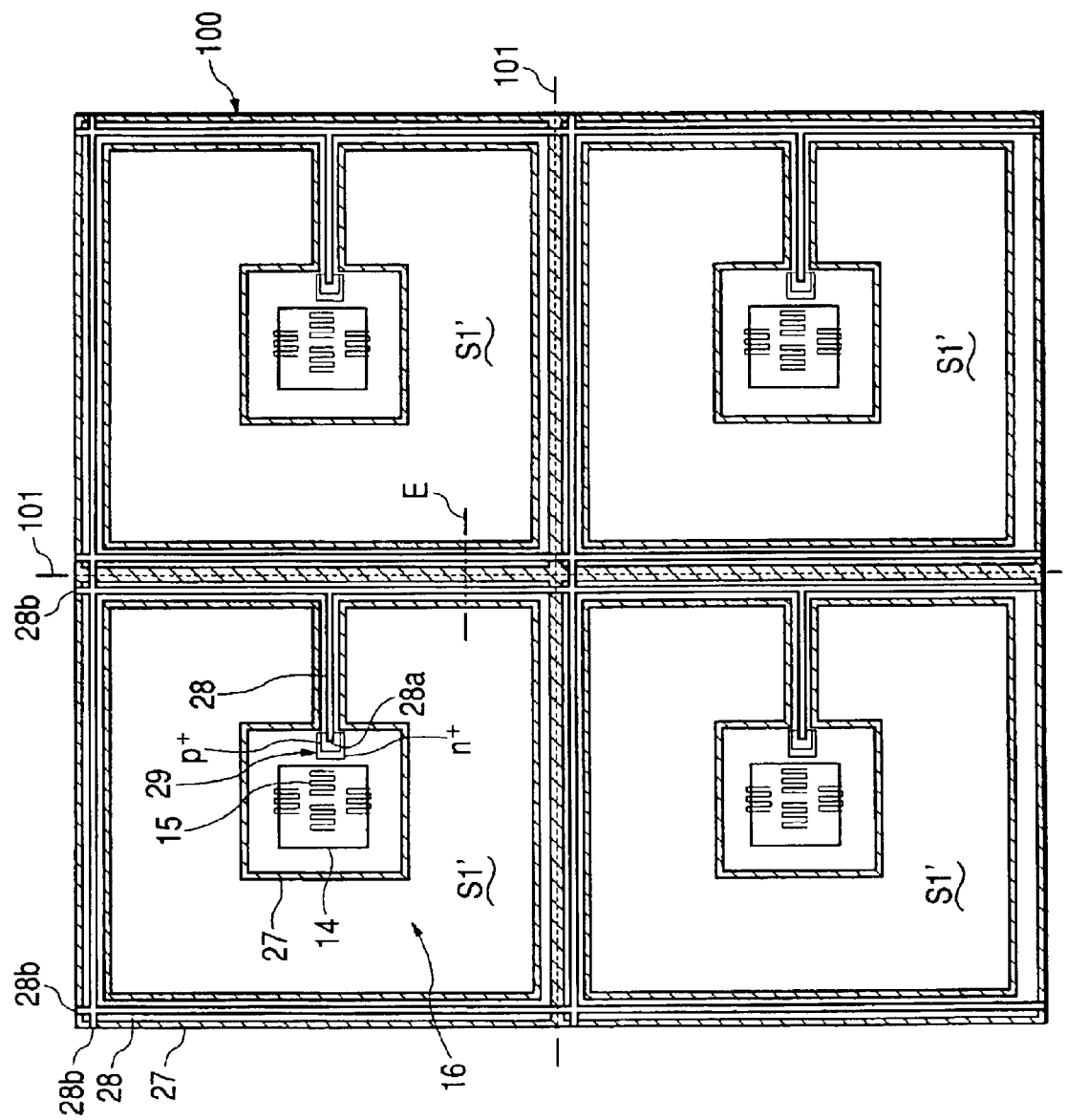
FIG. 10 is a plan view of the silicon wafer for the integrated pressure sensors according to a second embodiment of the present invention.
Figure 11:
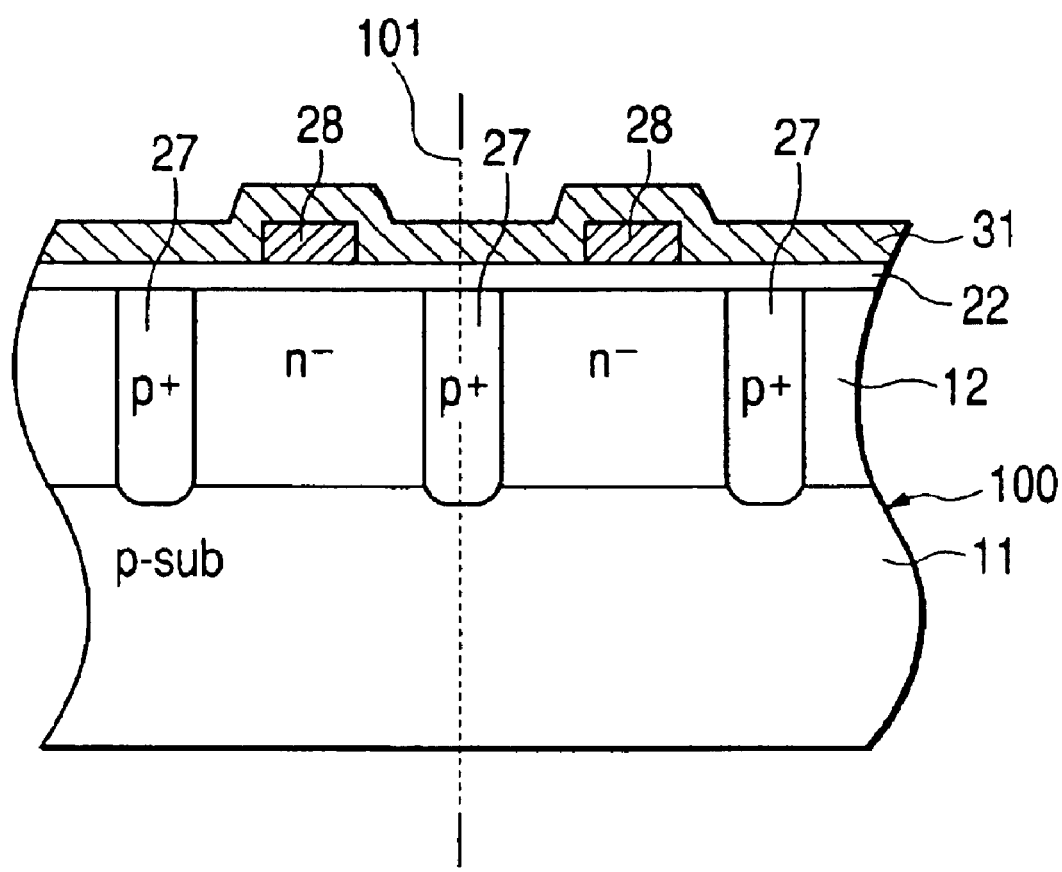
FIG. 11 is a partial sectional elevation view of the silicon wafer, taken on the line E in FIG. 10.

The integrated pressure sensor according to the second embodiment has substantially the same structure as that of the first embodiment. The difference is in the pattern of the etching wires 28. FIG. 10 is a plan view of the silicon wafer 100 for the integrated pressure sensors according to the second embodiment. FIG. 11 is a partial sectional elevation view of the silicon wafer 100, taken on the line E in FIG. 10.

In the first embodiment, each of the etching lines 28 are vertically and horizontally arranged like a mesh of a grid outside the scribe line 101 at the boundary between one silicon chip 10 and the neighbor silicon chip 10, wherein a mesh spreads over three consecutive chip units S1'. On the other hand, in this embodiment, one etching line 28 is further provided at each silicon chip 10 vertically (in FIG. 10), so that one mesh spreads over two chip units S1'. More specifically, in FIG. 10, there are etching lines 28 at the both sides of one vertically arranged (in the drawing) scribe line 101. FIG. 11 more clearly shows this arrangement in a sectional elevation view. Therefore, each silicon chip 10 has two vertically arranged etching lines 28 at both vertical edges (in the drawing) of the silicon chip 10.

As mentioned above, the pattern of the etching wires 28 on the silicon wafer 100 can be modified.

[Third Embodiment]

Figure 12:
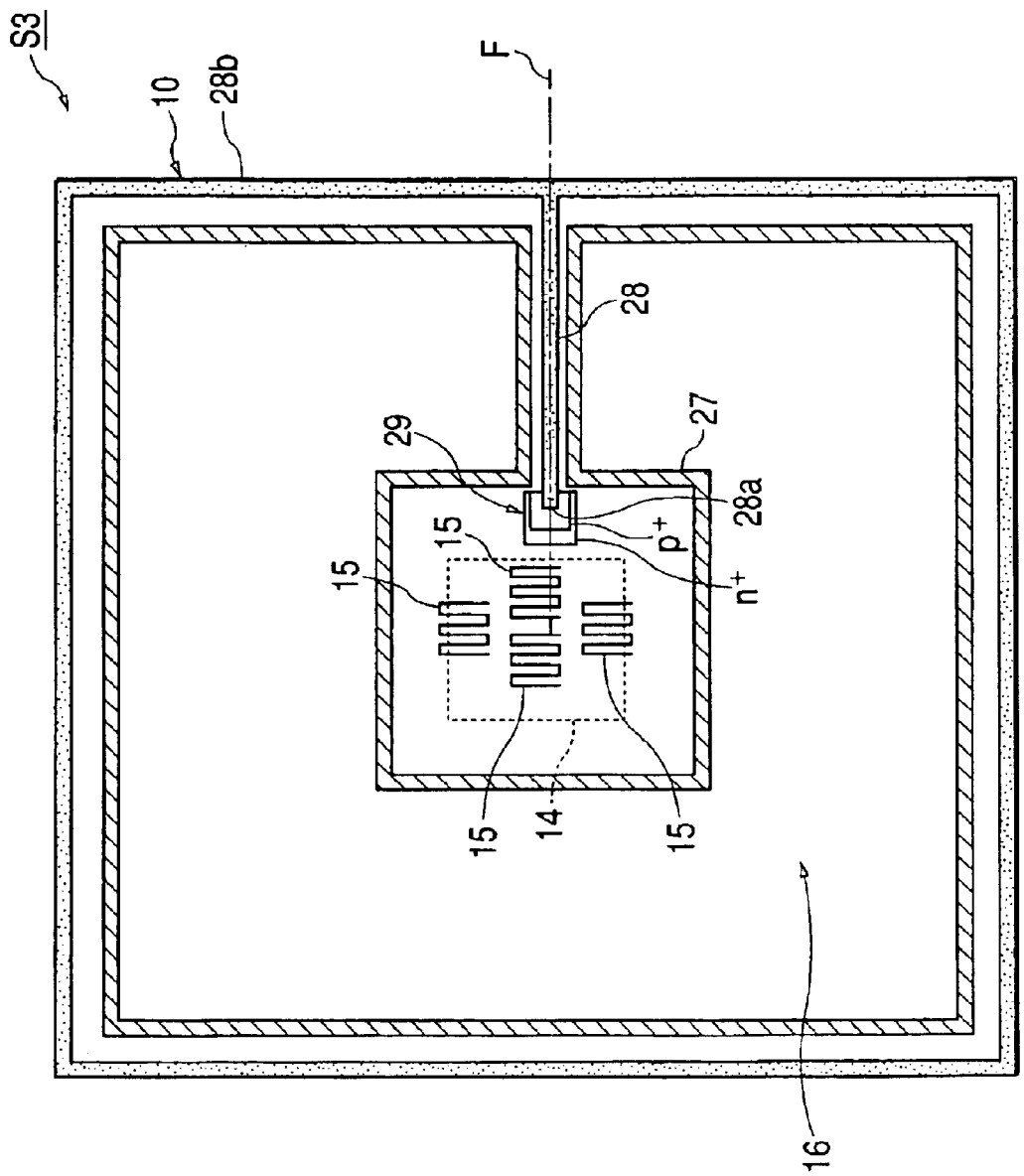
FIG. 12 is a plan view of the silicon chip of the integrated pressure sensors according to a third embodiment of the present invention.
Figure 13:
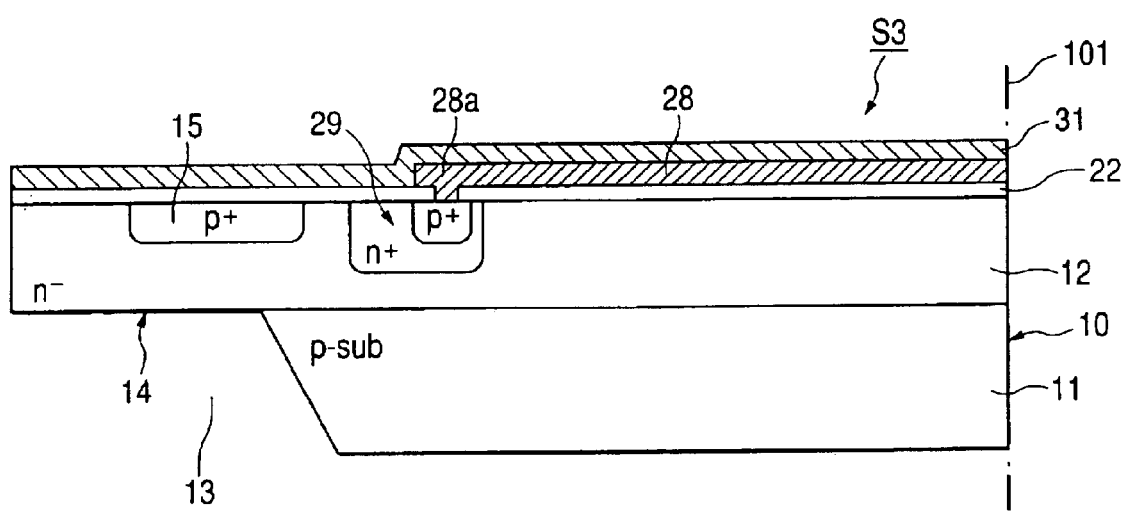
FIG. 13 is a partial sectional elevation view of the silicon chip, taken on the line F in FIG. 12.

The integrated pressure sensor according to the third embodiment has substantially the same structure as that of the first embodiment. The difference is in that the impurity diffusion layer 27 provided at the edges of the silicon chip 10 are omitted, and the etching wires 28 are arranged at the peripheral edges of each silicon chip in form of square mesh. FIG. 12 is a plan view of the silicon chip 10 of the integrated pressure sensors. FIG. 13 is a partial sectional elevation view of the silicon chip 10, taken on the line F in FIG. 12.

In this embodiment, the etching wire 28 does not cross the impurity diffusion layer 27 between the one end 28a and other ends 28b also. In other words, the etching wire 28 dose not cross the impurity diffusion layer 27 at the inside area (non-edge portion) of the silicon chip 10. This structure provides the same operation as that of the first embodiment.

Here, with respect to the cutting process of the silicon wafer 100, because of no impurity diffusion layer 27 at the edges of the silicon chip 10, this embodiment is selectively adopted for the case where the disturbance in the crystal structure due to cutting at the pn junction interface at the edges of the silicon chip 10 is controllable.

Moreover, in this embodiment, the scribe lines 101 are arranged so as to contact the etching wires 28. Then, the etching liens 28 are cut in the dicing cut process. During this, the dicer may clog up or a chip of the etching wire developed by cutting may remain at the edge of the silicon chip 10, which may form a leak path.

According to this embodiment, after the electrochemical etching process and before the dicing cut process, the etching wires at the edge of the silicon chip 10 can be partially removed by etching.

[Modification]

This invention is applicable to semiconductor devices, such as a gas sensor, an infrared ray sensor, a humidity sensor, with the integrated circuit and the diaphragm formed by electrochemical etching in the semiconductor substrate including a first semiconductor layer with the first conductivity and a second semiconductor layer with the second conductivity laminated with the first semiconductor layer.

What is claimed is:

1. A method of producing a semiconductor device comprising the steps of:

preparing a semiconductor wafer including a first semiconductor layer having a first conductivity and a second semiconductor layer having a second conductivity on said first semiconductor layer;

forming, at each chip unit, an impurity diffusion layer with said first conductivity piercing said second semiconductor layer from an surface of said second semiconductor layer opposite to said first semiconductor layer to a surface of said first semiconductor layer contacting said second semiconductor layer, having a predetermined width with respect to said surface of said second semiconductor layer, and extending along said surface of said second semiconductor layer for sectioning said second semiconductor layer into a plurality of blocks for insulation;

forming an integrated circuit portion on said surface of said second semiconductor layer at each chip unit;

forming, at each chip unit, a wire, at a first end, being connected to said second semiconductor layer at the inside of said chip unit and extending, at the second opposite end, to one of scribe lines defining said chip unit, wherein said wire between said first end and said second end of said wire does not cross said impurity diffusion layer except at said second end;

effecting electrochemical etching said first semiconductor layer with said wire to form said hollow portion and said thin portion; and cutting said semiconductor wafer along said scribe lines.

* * * * *